United States Patent
Suzuki

(10) Patent No.: US 7,709,917 B2
(45) Date of Patent: May 4, 2010

(54) SOLID STATE IMAGING DEVICE AND METHOD OF MANUFACTURING THE SAME

(75) Inventor: Noriaki Suzuki, Miyagi (JP)

(73) Assignee: Fujifilm Corporation, Tokyo (JP)

( * ) Notice: Subject to any disclaimer, the term of this patent is extended or adjusted under 35 U.S.C. 154(b) by 296 days.

(21) Appl. No.: 11/945,819

(22) Filed: Nov. 27, 2007

(65) Prior Publication Data
US 2008/0122022 A1 May 29, 2008

(30) Foreign Application Priority Data
Nov. 29, 2006 (JP) ............ P2006-321783

(51) Int. Cl.
*H01L 31/058* (2006.01)
(52) U.S. Cl. ............ 257/435; 257/448; 257/E31.122
(58) Field of Classification Search ........ 257/431, 257/435, 448, 83, E31.122
See application file for complete search history.

(56) References Cited

U.S. PATENT DOCUMENTS

| | | | | |
|---|---|---|---|---|
| 5,492,852 A * | 2/1996 | Minami | ......... | 438/60 |
| 5,585,653 A * | 12/1996 | Nakashiba | ......... | 257/232 |
| 6,188,119 B1 * | 2/2001 | Ogawa et al. | ......... | 257/435 |
| 6,781,167 B2 * | 8/2004 | Uya et al. | ......... | 257/215 |
| 6,946,694 B2 * | 9/2005 | Okamoto et al. | ......... | 257/222 |
| 7,382,003 B2 * | 6/2008 | Homma | ......... | 257/233 |
| 7,570,292 B2 * | 8/2009 | Hioki | ......... | 348/294 |
| 7,589,366 B2 * | 9/2009 | Suzuki | ......... | 257/294 |
| 2005/0145963 A1 * | 7/2005 | Saitoh | ......... | 257/428 |
| 2007/0034869 A1 * | 2/2007 | Saito | ......... | 257/53 |
| 2007/0057286 A1 * | 3/2007 | Sato | ......... | 257/183 |
| 2008/0035604 A1 * | 2/2008 | Tsukamoto | ......... | 216/26 |
| 2009/0035887 A1 * | 2/2009 | Suzuki et al. | ......... | 438/57 |

FOREIGN PATENT DOCUMENTS

JP 7-45808 A 2/1995

* cited by examiner

*Primary Examiner*—David A Zarneke
(74) *Attorney, Agent, or Firm*—Birch, Stewart, Kolasch & Birch, LLP

(57) ABSTRACT

A solid state imaging device comprises: a photoelectric converting portion; a charge transferring portion including a charge transfer electrode for transferring an electric charge generated in the photoelectric converting portion; and a shielding film formed through an insulating film containing nitrogen on the charge transferring portion, wherein the insulating film containing the nitrogen includes: a first insulating film that covers at least a part of an upper surface of the charge transfer electrode; and a second insulating film formed to reach the upper surface of the charge transfer electrode from the photoelectric converting portion, and the first and second insulating films include a discontinuing portion.

16 Claims, 6 Drawing Sheets

SOLID STATE IMAGING DEVICE AND METHOD OF MANUFACTURING THE SAME

BACKGROUND OF THE INVENTION

1. Field of the Invention

The present invention relates to a solid state imaging device and a method of manufacturing the solid state imaging device, and more particularly to an antireflection film.

2. Description of the Invention

In recent years, in a solid state imaging device, the number of imaging pixels has been increased to gigapixels or more, and a fineness of a pixel region has also been enhanced increasingly. In such a situation, there has been proposed a structure in which a film having a high refractive index for an antireflection is formed on a photoelectric converting portion constituted by a photodiode, while the periphery of a light receiving region is coated with a tungsten shielding film in order to reduce a smear.

In the related-art solid state imaging device, a charge transfer electrode is formed on a surface of a silicon substrate through a gate insulating film and an antireflection film constituted by an insulating film such as a silicon nitride film is formed thereon through an insulating film, and a shielding film having an opening in a light receiving region is formed thereon.

In the solid state imaging device, the antireflection film is to be formed thickly in order to ensure a breakdown voltage between the charge transfer electrode and the shielding film, and the shielding film is formed on the thick antireflection film. With the structure, there is a problem in that a multiple reflection is generated between the shielding film and the antireflection film when the antireflection film is formed thickly and an oblique incident light transmitted from the photodiode into the charge transfer path deteriorates a smear.

In recent years, therefore, there has been proposed a solid state imaging device in which a charge transfer electrode is covered with an ONO film having a three-layer structure including a silicon oxide film, a silicon nitride film and a silicon oxide film in order to ensure a breakdown voltage between the charge transfer electrode and the shielding film and between the silicon substrate and the shielding film (See JP-A-7-45808).

In the related-art solid state imaging device, it is possible to enhance the breakdown voltage by using the ONO film. With the structure, however, the silicon nitride film in the ONO film is removed from the photoelectric converting portion. For this reason, there is still a problem in that an incident light on the photoelectric converting portion is reflected, and a reduction in a sensitivity sometimes causes a problem.

In the case of a two-layer electrode structure, moreover, a silicon nitride film to be an antireflection film for covering a photoelectric converting portion is usually formed on a first electrode. In this case, in FIG. 8 showing a section of a charge transfer electrode portion, there is a problem in that a distance between a shielding film 6 and a second electrode 3b is reduced at an edge of the second electrode 3b and a defective breakdown voltage is apt to be generated. 3a denotes a first electrode, and 4 and 5 denote an insulating film such as silicon oxide. In this connection, a voltage to be applied between the shielding film and a substrate is 0V, while a voltage to be applied between the shielding film 6 and the second electrode 3b is −8 to +15V. Moreover, there is a problem in that a passage for hydrogen at a hydrogen annealing step is eliminated when the silicon nitride is formed to cover the second electrode 3b. There is also a problem in that it is hard to carry out a pattern formation over a concavo-convex surface with high precision when an opening for hydrogen annealing is to be formed on the silicon nitride film.

SUMMARY OF THE INVENTION

In consideration of the actual circumstances, it is an object of the invention to provide a solid state imaging device having a high sensitivity and a low smear while maintaining a breakdown voltage between a shielding film and a charge transfer electrode also in a microfabrication of a device.

The invention provides a solid state imaging device comprising: a photoelectric converting portion; a charge transferring portion including a charge transfer electrode for transferring an electric charge generated in the photoelectric converting portion; and a shielding film formed through an insulating film containing nitrogen on the charge transferring portion, wherein the insulating film containing the nitrogen includes: a first insulating film that covers at least a part of an upper surface of the charge transfer electrode; and a second insulating film formed to reach the upper surface of the charge transfer electrode from the photoelectric converting portion, and the first and second insulating films include a discontinuing portion.

By the structure, the insulating film including the nitrogen and formed to cover the charge transferring portion for an insulation from the shielding film is constituted by the film having a two-layer structure which is formed through the discontinuing portion. Therefore, it is possible to independently set a thickness for the charge transfer electrode and the photoelectric converting portion and to enhance a dielectric voltage of the charge transfer electrode and the shielding film without increasing a smear.

With the structure, the first and second insulating films may be separated from each other to have the discontinuing portion or may slightly overlap with each other through silicon oxide. Accordingly, high pattern precision is not required. Therefore, patterning can easily be carried out. In the case in which the first and second insulating films are formed with a slight separation from each other to have the discontinuing portion over the charge transferring portion, it is possible to prevent a hydrogen terminating treatment (hydrogen annealing) effect from being suppressed. If the thickness of the first insulating film is set to be greater than that of the second insulating film, it is possible to raise the breakdown voltages of the shielding film and the second electrode. Moreover, it is possible to reduce the thickness of the antireflection film (the second insulating film) over the photoelectric converting portion at a maximum and to maximize an opening area defining a light receiving region. Moreover, a passage for hydrogen in a hydrogen annealing treatment is formed so that a characteristic can easily be enhanced.

Moreover, the invention provides the solid state imaging device, wherein the second insulating film has a region which overlaps with the first insulating film through silicon oxide.

By the structure, an insulation can surely be carried out, and furthermore, the silicon oxide film is provided between the first and second insulating films. Therefore, a passage for hydrogen in a hydrogen annealing treatment is formed so that a characteristic can easily be enhanced.

Furthermore, the invention provides the solid state imaging device, wherein the second insulating film constitutes an antireflection film.

In addition, the invention provides the solid state imaging device, wherein the charge transferring portion comprises: a first electrode formed by a first layer conductive film; and a second electrode disposed to get over a part of the first electrode and formed by a second layer conductive film.

Moreover, the invention provides the solid state imaging device, wherein the charge transferring portion forms a single layer electrode structure in which a first electrode formed by a first layer conductive film and a second electrode formed by a second layer conductive film are juxtaposed with each other through an interelectrode insulating film.

Furthermore, the invention provides the solid state imaging device, wherein the second insulating film is formed to reach an upper surface of the first electrode from the photoelectric converting portion, and the first insulating film is formed to cover an upper surface of the second electrode from the upper surface of the first electrode.

By the structure, the second electrode to which a higher voltage is apt to be applied is covered with the thicker first insulating film. It is desirable that an end of the second insulating film should be formed exactly on an upper edge of the first electrode in patterning. However, the second insulating film may be formed to reach an upper surface of the first electrode. In the case in which the second insulating film is formed to reach the upper surface of the first electrode, the patterning can easily be carried out.

In addition, the invention provides the solid state imaging device, wherein the second insulating film is formed to have different thicknesses in a region provided on a substrate.

By the structure, it is possible to regulate the thickness of the second insulating film for covering the photoelectric converting portion corresponding to a necessary sensitivity. For example, it is possible to properly carry out a regulation corresponding to a necessary sensitivity, for example, to reduce the thickness of the second insulating film in the peripheral edge portion of a chip having a sensitivity which is apt to be reduced. Moreover, it is also possible to change the thickness in the peripheral edge portion and the central portion of a wafer, thereby regulating the sensitivity.

The invention provides a method of manufacturing a solid state imaging device comprising: forming a photoelectric converting portion and a charge transferring portion including a charge transfer electrode for transferring an electric charge generated in the photoelectric converting portion; forming an insulating film containing nitrogen for covering the charge transferring portion; and forming a shielding film having an opening on the photoelectric converting portion, wherein, prior to forming the shielding film, forming the insulating film comprises: forming a first insulating film containing nitrogen and formed to cover at least a part of an upper surface of the charge transferring portion; and forming a second insulating film containing nitrogen and formed to reach the upper surface of the charge transfer electrode from the photoelectric converting portion, and wherein the first insulating film and the second insulating film are formed to have a discontinuing portion.

By the structure, it is possible to independently form the insulating film containing the nitrogen to properly have a necessary thickness by carrying out two steps to have the discontinuing portion. Moreover, it is possible to easily carry out hydrogen annealing by forming the discontinuing portion.

Furthermore, the invention provides the method of manufacturing a solid state imaging device, wherein the first insulating film and the second insulating film are constituted to have regions superposed through a silicon oxide film.

By the structure, the first and second insulating films are superposed through the silicon oxide film. Therefore, it is possible to carry out the hydrogen annealing well and to sufficiently raise a dielectric voltage.

In addition, the invention provides the method of manufacturing a solid state imaging device, wherein the second insulating film is formed to constitute an antireflection film.

By the structure, the insulating film containing the nitrogen such as the silicon nitride film acts as an excellent antireflection film over the surface of the photoelectric converting portion.

Moreover, the invention provides the method of manufacturing a solid state imaging device, wherein the charge transferring portion comprises: a first electrode formed by a first layer conductive film; and a second electrode disposed to get over a part of the first electrode and formed by a second layer conductive film.

Furthermore, the invention provides the method of manufacturing a solid state imaging device, wherein the charge transferring portion forms a single layer electrode structure in which a first electrode formed by a first layer conductive film and a second electrode formed by a second layer conductive film are juxtaposed with each other through an interelectrode insulating film.

In addition, the invention provides the method of manufacturing a solid state imaging device, wherein forming the first insulating film comprises forming the first insulating film to cover an upper surface of the second electrode from an upper surface of the first electrode, and forming the second insulating film comprises carrying out patterning to reach the upper surface of the first electrode from the photoelectric converting portion.

By the structure, a margin in the patterning step is also great and the patterning can easily be carried out.

Moreover, the invention provides the method of manufacturing a solid state imaging device, wherein forming the second insulating film comprises determining a thickness in order to have a desirable sensitivity corresponding to a sensitivity of the photoelectric converting portion.

Furthermore, the invention provides the method of manufacturing a solid state imaging device, wherein the first and second insulating films are silicon nitride films.

In addition, the invention provides the method of manufacturing a solid state imaging device, wherein the shielding film is a tungsten film.

By the structure, it is possible to obtain a shielding structure having a high reliability. By a combination with the silicon nitride to be the antireflection film, moreover, it is possible to form a stable solid state imaging device having a high reliability.

DETAILED DESCRIPTION OF THE INVENTION

An embodiment according to the invention will be described below in detail with reference to the drawings.

First Embodiment

Figure 1:
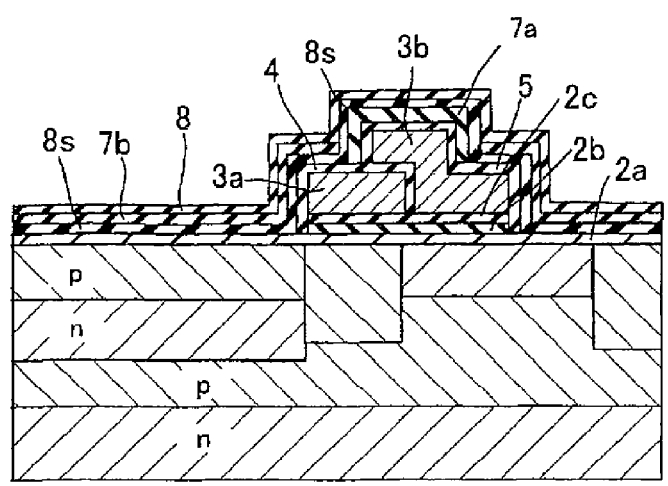
FIG. 1 is a sectional view showing a main part of a solid state imaging device according to a first embodiment of the invention.
Figure 2:
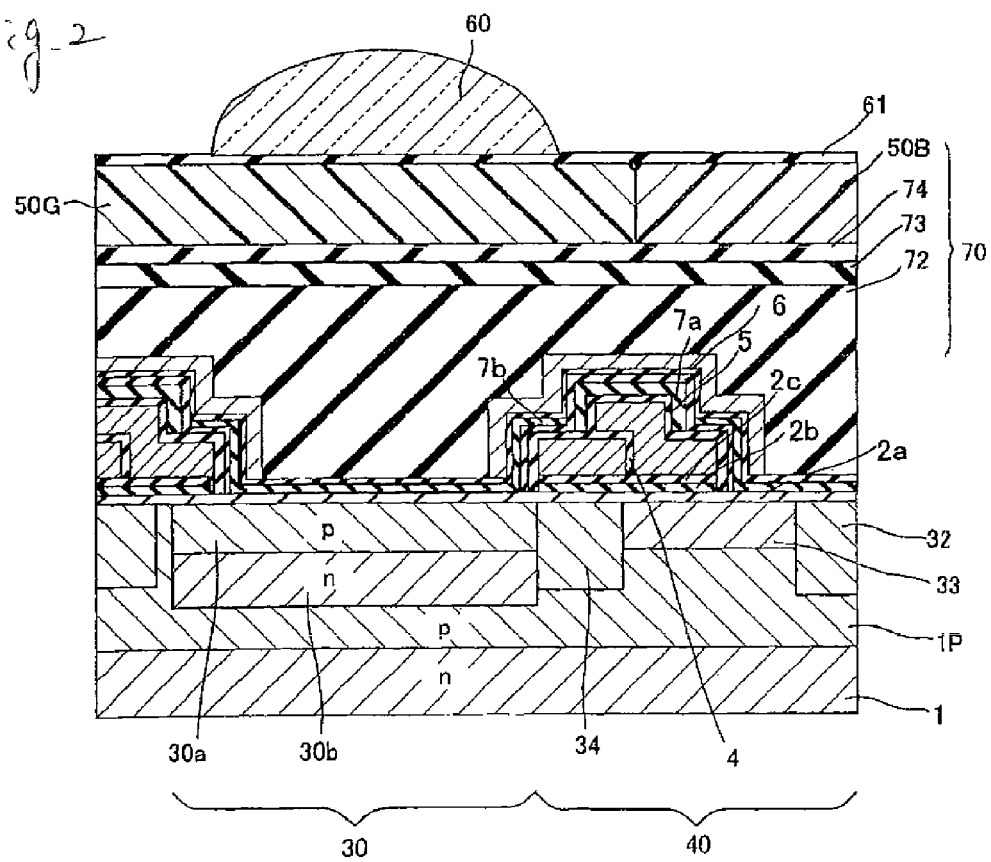
FIG. 2 is a sectional view showing the solid state imaging device according to the first embodiment of the invention.
Figure 3:
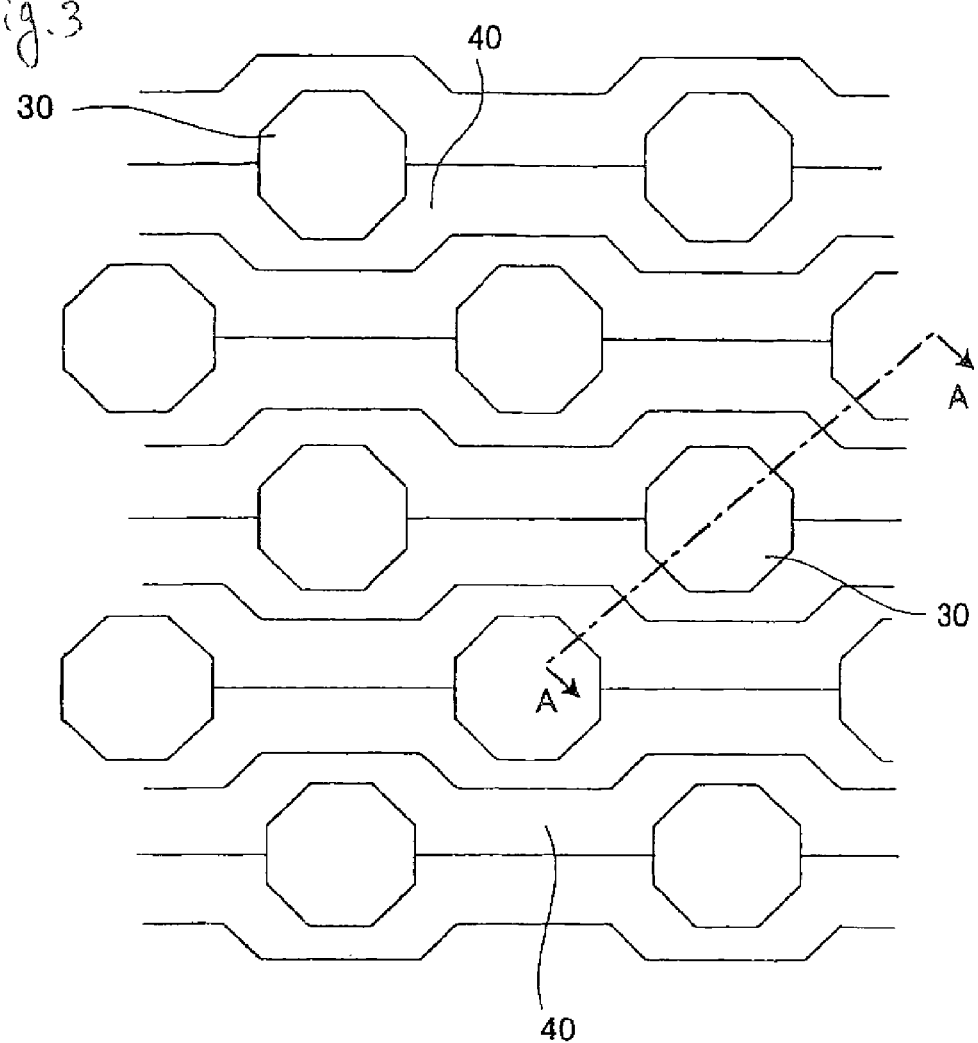
FIG. 3 is a plan view showing the solid state imaging device according to the first embodiment of the invention.

FIG. 1 is a sectional view showing a main part of a solid state imaging device, FIG. 2 is a sectional view showing the solid state imaging device, and FIG. 3 is a plan view. FIG. 2 is a view showing an A-A section in FIG. 3. FIG. 1 is an enlarged view for explaining a shielding film and an antireflection film in FIG. 2. As shown in FIG. 1, the solid state imaging device has an insulating film 7 constituted by a first insulating film 7a formed by a silicon nitride film which has a thickness of 50 nm and covers a charge transfer electrode 3 (a second electrode 3b) and a second insulating film (an antireflection film) 7b formed by a silicon nitride film which has a thickness of 30 nm and is extended over the first electrode from a photoelectric converting portion, and a silicon oxide film 8s is provided between the first and second insulating films 7a and 7b in the edge regions, and furthermore, a shielding film 6 is formed on the first and second insulating films 7a and 7b. In the solid state imaging device, the charge transfer electrode 3 of the charge transferring portion formed on a silicon substrate 1 is constituted by a polycrystalline silicon layer and has a two-layer electrode structure in which the second electrode 3b is formed to get over a first electrode 3a through an interelectrode insulating film 4, and a gate oxide film 2 formed under the charge transfer electrode 3 is constituted by a (ONO) film having a lamination structure including a bottom oxide film 2a formed by a silicon oxide (SiO) film provided on a surface of the semiconductor substrate, a silicon nitride (SiN) film 2b formed on the bottom oxide film, and a top oxide film 2c formed by a silicon oxide (SiO) film provided on the silicon nitride film. A portion between the charge transfer electrodes 3 is constituted by the interelectrode insulating film 4 constituted by silicon oxide.

In the solid state imaging device, as shown in FIG. 2, a p well layer 1P is formed on a surface of the silicon substrate 1, and an n region 30b forming a pn junction is formed and a p region 30a is formed on a surface in the p well layer 1P to constitute a photodiode 30, and a signal charge generated in the photodiode 30 is stored in the n region 30b.

A charge transfer channel 33 constituted by an n region is formed slightly separately in a rightward part of the photodiode 30. A charge reading region 34 is formed in the p well layer 1P between the n region 30b and the charge transfer channel 33 so that a charge transferring portion 40 is constituted.

Thus, the charge transferring portion 40 includes a plurality of charge transfer channels 33 formed in a lateral direction in the surface portion of the silicon substrate 1 corresponding to respective photodiode lines, the charge transfer electrode 3 formed on the charge transfer channel 33, and the charge reading region 34 for reading electric charges generated in the photodiode 30 into the charge transfer channel 33.

The gate oxide film 2 is formed on the surface of the silicon substrate 1, and the charge transfer electrode 3 constituted by the first electrode 3a and the second electrode 3b is formed on the charge reading region 34 and the charge transfer channel 33 through the gate oxide film 2. The interelectrode insulating film 4 is formed between the first electrode 3a and the second electrode 3b. A channel stop 32 constituted by a p$^+$ region is provided on a right side of the vertical transfer channel 33 and a separation from the adjacent photodiode 30 is obtained.

An insulating film 5 constituted by a two-layer film including a silicon oxide film and an LPCVD silicon film is formed on the charge transfer electrode 3, and the first insulating film 7a, the silicon oxide film 8s and the second insulating film 7b are formed thereon and the second insulating film 7b constitutes an antireflection layer. Furthermore, the shielding film 6 constituted by a tungsten film is formed through a silicon oxide film 8. The shielding film 6 is formed through a titanium nitride film (not shown) to be an adherent layer.

Moreover, an intermediate layer 70 is formed on the shielding film 6. In the intermediate layer 70, 72 denotes a flattened film (an insulating film) formed of BPSG (borophospho silicate glass), 73 denotes an insulating film (a passivation film) formed of P—SiN, and 74 denotes an under filter flattened film formed by a transparent resin. The shielding film 6 is provided excluding an opening portion of the photodiode 30. A color filter 50 and a microlens 60 are provided above the intermediate layer 70. An on filter flattened film 61 formed by an insulating transparent resin is provided between the color filter 50 and the microlens 60. 50G denotes a green filter layer and 50B denotes a blue filter layer.

The solid state imaging device according to the embodiment has such a structure that a signal charge generated in the photodiode 30 is stored in the n region 30b, the signal charge thus stored is transferred in a lateral direction through the charge transfer channel 33, the signal charge thus transferred is transmitted in a longitudinal direction through a horizontal charge transfer path (HCCD) which is not shown, and a color signal corresponding to the signal charge thus transferred is output from an amplifier which is not shown. More specifically, a solid state imaging device portion to be a region including the photoelectric converting portion, the charge transferring portion, the HCCD and the amplifier and a peripheral circuit portion to be a region provided with a peripheral circuit (a PAD portion) of the solid state imaging device are formed on the silicon substrate 1 so that the solid state imaging device is constituted.

Next, a process for manufacturing the solid state imaging device will be described in detail with reference to FIGS. 4A to 4C and 5A to 5C.

The manufacture of the solid state imaging device is simply different from an ordinary process in that the insulating film 7 for covering the charge transfer electrode has a two-layer structure through the silicon oxide film 8s, and the others are executed by the ordinary steps. FIGS. 4A to 4C and 5A to 5C are views showing the manufacturing process.

First of all, a photoelectric converting portion and a charge transferring portion are formed on a silicon substrate 1 by an ordinary method. For example, the charge transferring portion is formed in the following manner. The silicon oxide film 2a having a thickness of 25 nm, a silicon nitride film 2b having a thickness of 50 nm, and a silicon oxide film 2c having a thickness of 10 nm are formed on a surface of the n-type silicon substrate 1 having an impurity concentration of approximately $7 \times 10^{14}$ cm$^{-3}$ so that a gate oxide film 2 having a three-layer structure is formed. Subsequently, a polycrystalline silicon film 3a to be a first layer doped in a high concentration is formed on the gate oxide film 2 by low pressure CVD using a mixed gas of SiH$_4$ and PH$_3$.

Then, the polycrystalline silicon layer is subjected to patterning by photolithography to form the first electrode 3a.

Thereafter, a silicon oxide film (an interlayer insulating film 4) having a thickness of 100 nm is formed by a thermal oxidation.

Furthermore, a polycrystalline silicon film 3b to be a second layer doped in a high concentration and having a thickness of 0.2 to 1.0 μm is formed by the low pressure CVD using the mixed gas of $SiH_4$ and $PH_3$ and is subjected to the patterning to form a charge transfer electrode 3 having a two-layer structure.

Figure 4A:
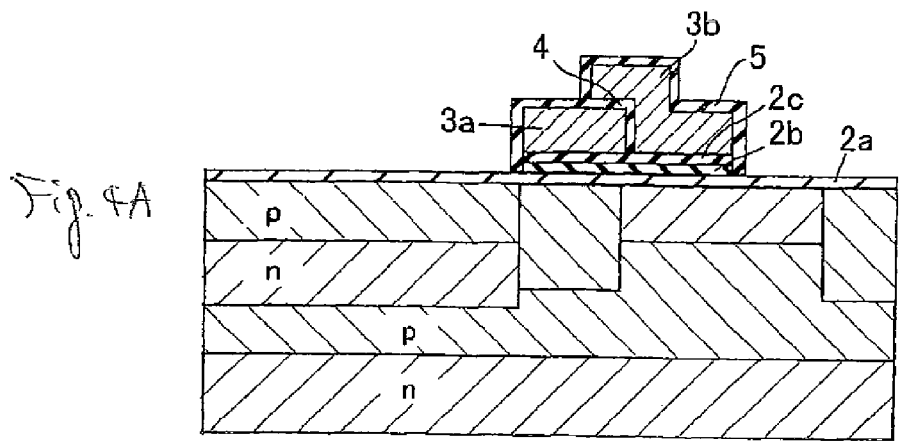
FIGS. 4A to 4C are views showing a process for manufacturing the solid state imaging device according to the first embodiment of the invention.
Figure 4B:
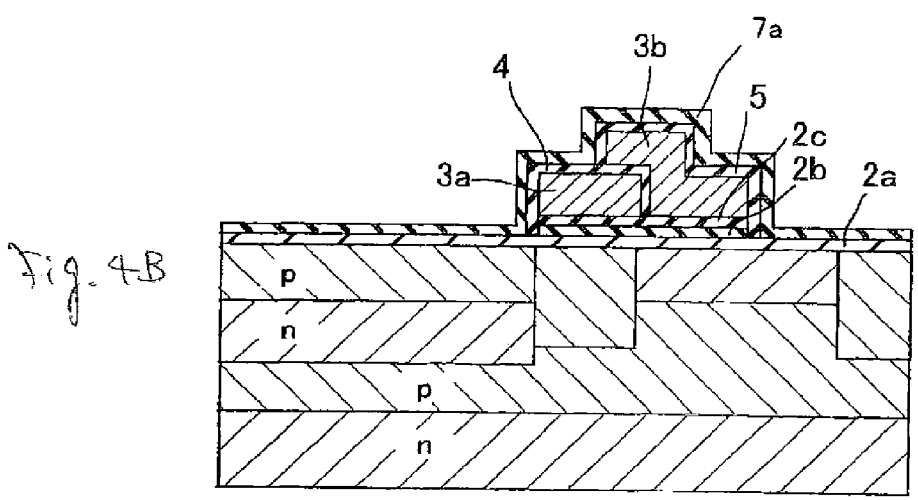

As shown in FIG. 4A, next, a silicon oxide film 5 is formed around the charge transfer electrode 3.

Then, a silicon nitride film (7a) having a thickness of 50 nm is formed by the low pressure CVD (FIG. 4B) and is subjected to the patterning by the photolithography to form the first insulating film 7a.

Figure 4C:
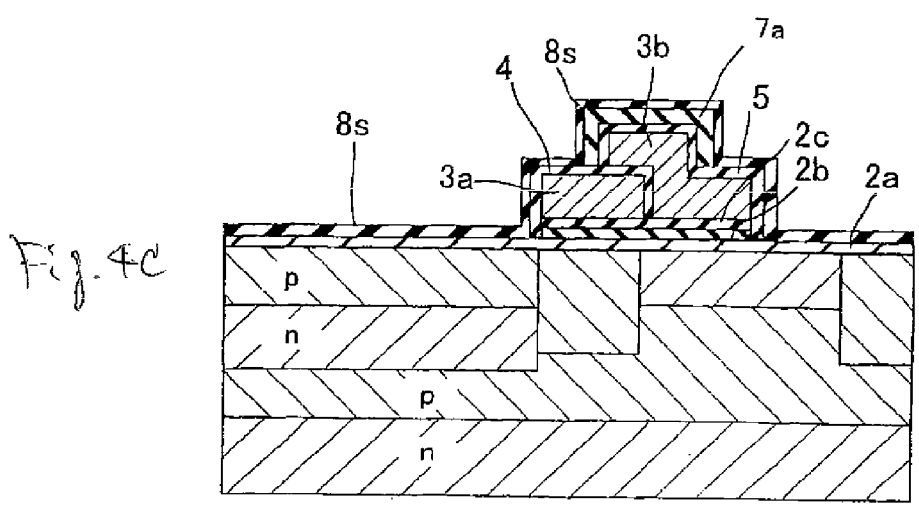

Furthermore, a silicon oxide film 8s having a thickness of 20 nm is formed by the CVD (FIG. 4C).

Next, a silicon nitride film (7b) having a thickness of 30 nm is formed by the low pressure CVD (FIG. 5A) and is subjected to the patterning by the photolithography to form the second insulating film 7b.

Thereafter, a silicon oxide film 8 is formed (FIG. 5B) and a titanium nitride layer is then formed by sputtering to form a thin tungsten film 6 by the CVD.

Figure 5A:
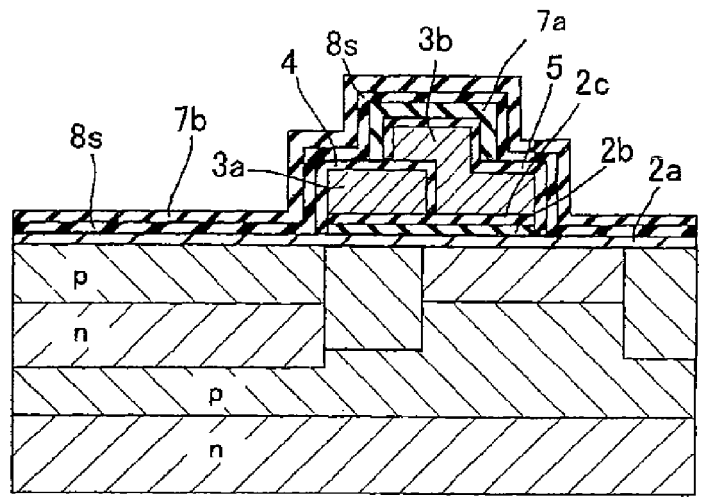
FIGS. 5A to 5C are views showing the process for manufacturing the solid state imaging device according to the first embodiment of the invention.
Figure 5B:
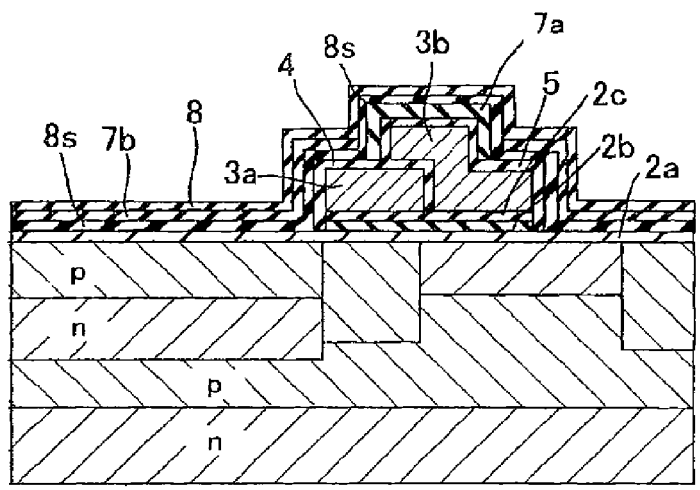
Figure 5C:
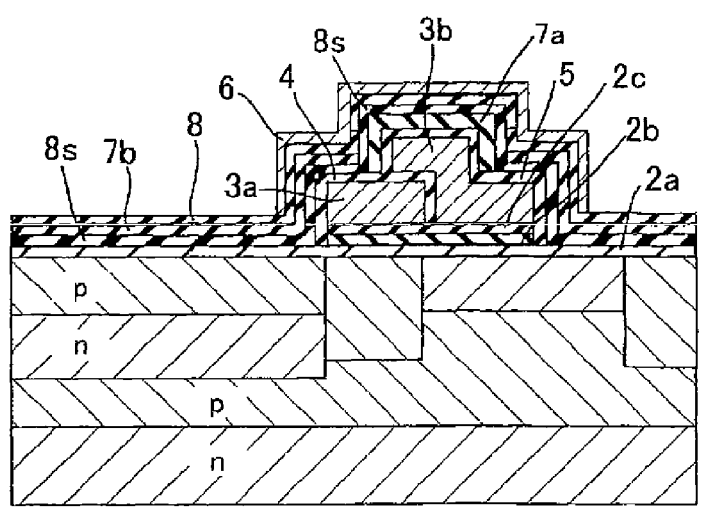

Then, the thin tungsten film 6 is subjected to the patterning in order to have an opening on a photodiode region 30 by the photolithography (FIG. 5C).

Subsequently, a BPSG film is formed on the thin tungsten film 6 and is subjected to a heating reflow to form a flattened film 72. A contact and a metal wiring are then formed and a silicon nitride film 73 is thereafter formed thereon by P-CVD.

Next, a color filter 50 and an on filter flattened film 61 are formed through an under filter flattened film 74 constituted by a resin film and a microlens 60 is finally formed so that the solid state imaging device shown in FIG. 1 is formed.

According to the method, by only covering a portion from the photoelectric converting portion to the first electrode with the second insulating film having a comparatively small thickness and covering a portion from the first electrode to the second electrode with the first insulating film having a great thickness, it is possible to set a breakdown voltage between the second electrode and the shielding film to be sufficiently high while reducing a smear. Moreover, a passage for hydrogen is left by the presence of the silicon oxide film formed between the first insulating film and the second insulating film. Therefore, a hydrogen annealing effect can also be exhibited sufficiently. Although the first insulating film having a great thickness is formed and patterned and the second insulating film is then formed in the embodiment, it is also possible to carry out the patterning over the second insulating film from the photoelectric converting portion to the first electrode and to then form the silicon oxide film, and furthermore, to form the second electrode.

According to the invention, thus, it is possible to manufacture a solid state imaging device having a high breakdown voltage, a high sensitivity and a small smear very easily without increasing a man-hour and introducing special equipment.

While both the photoelectric converting portion and the charge transferring portion are covered with the insulating film constituted by the silicon nitride film, they are coated with the first and second insulating films formed independently of each other. The second insulating film acts as the antireflection film in the photoelectric converting portion. However, the first and second insulating films are formed independently. Therefore, it is also possible to change the thickness of the antireflection film in the photoelectric converting portion in a central part and a peripheral edge part of a wafer or a central part and a peripheral edge part of a solid state imaging device chip, thereby regulating a sensitivity, for example. The thicknesses of the first and second insulating films may be almost equal to each other. In the case in which the breakdown voltage does not need to be high, moreover, the first insulating film may be thinner than the second insulating film.

Second Embodiment

Figure 6:
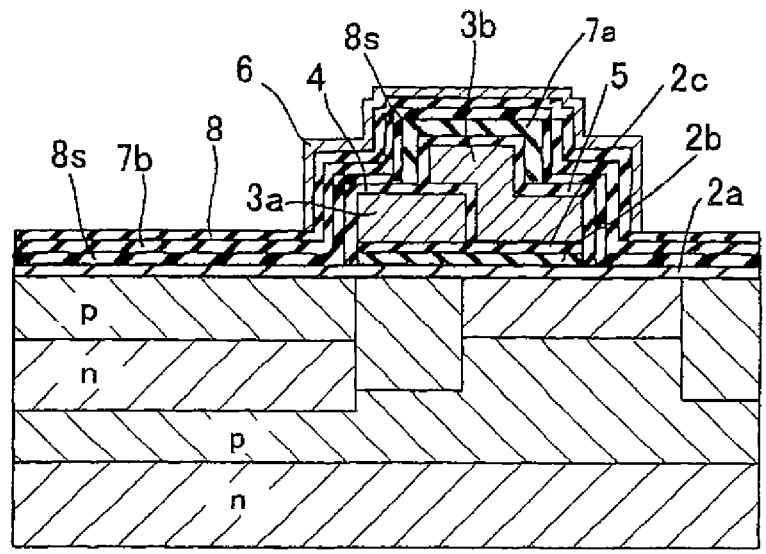
FIG. 6 is a view showing a solid state imaging device according to a second embodiment of the invention.
Figure 7:
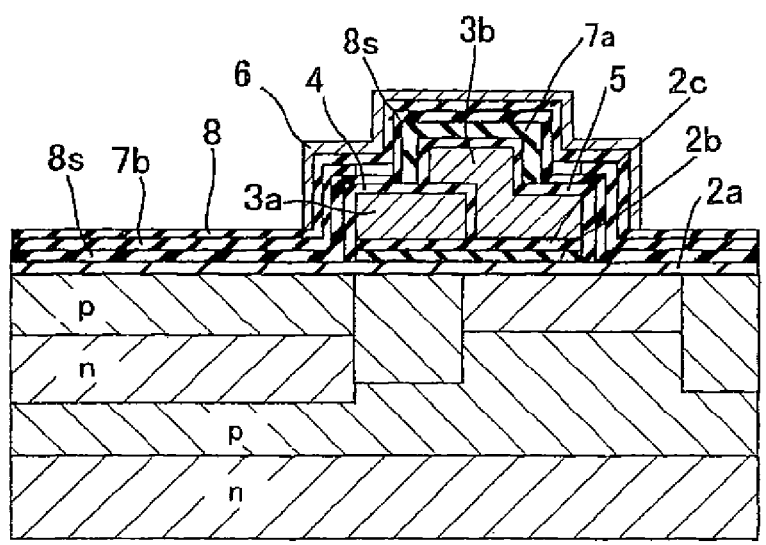
FIG. 7 is a view showing the solid state imaging device according to the second embodiment of the invention.
Figure 8:
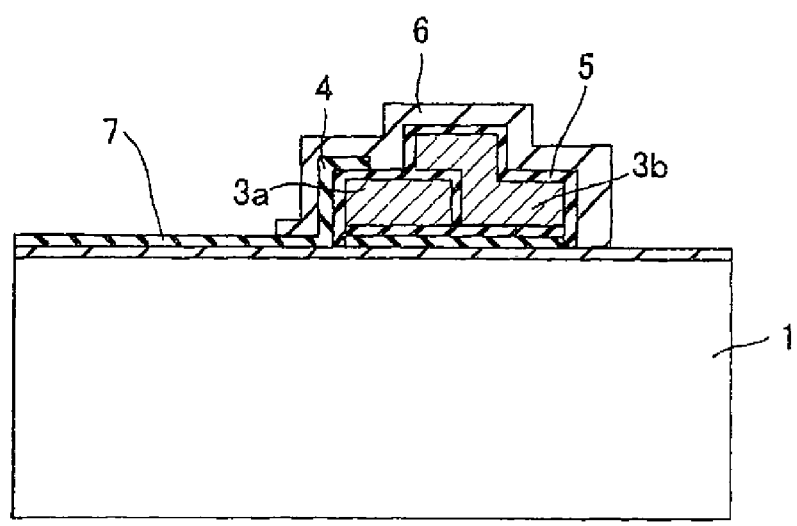
FIG. 8 is a view showing a solid state imaging device according to the related-art example.

While the first and second insulating films are formed to have a slight overlapping portion in the first embodiment, they may be formed to overlap with each other more greatly through silicon oxide or may be separated from each other without an overlap as shown in variants of FIGS. 6 and 7.

Third Embodiment

While the charge transfer electrode having a two-layer structure has been described in the first embodiment, the invention can also be applied to a charge transfer electrode having a single layer structure. In the embodiment, the whole charge transfer electrode having a single layer structure may be covered.

Although the first and second insulating films are constituted by a silicon nitride film in the embodiment, they may be formed by a silicon oxynitride film or a multilayer film containing the silicon nitride film. It is preferable that the second insulating film should have a film structure regulated so as to function as an antireflection film well.

As described above, according to the solid state imaging device in accordance with the invention, the insulating film containing the nitrogen which is formed between the shielding film and the charge transfer electrode is constituted by the film having the two-layer structure in which the discontinuing portion is provided and a thickness is greater than that of the surface of the substrate over the second electrode. Therefore, it is possible to easily reduce a smear while suppressing a drop in a breakdown voltage.

According to the method of manufacturing a solid state imaging device in accordance with the invention, moreover, it is possible to form a solid state imaging device having a high breakdown voltage, a small smear, high precision and a high reliability without requiring high pattern precision.

As described above, according to the solid state imaging device in accordance with the invention, it is possible to enhance breakdown voltages of a shielding film and a charge transfer electrode while reducing a smear and increasing a sensitivity very easily. Therefore, the invention is effective for a solid state imaging device having a fine charge transfer electrode and an enhancement in a pixel can be expected.

The entire disclosure of each and every foreign patent application from which the benefit of foreign priority has been claimed in the present application is incorporated herein by reference, as if fully set forth.

What is claimed is:

1. A solid state imaging device comprising:
   a photoelectric converting portion;
   a charge transferring portion including a charge transfer electrode for transferring an electric charge generated in the photoelectric converting portion; and
   a shielding film formed through an insulating film containing nitrogen on the charge transferring portion,
   wherein the insulating film containing the nitrogen includes:
   a first insulating film that covers at least a part of an upper surface of the charge transfer electrode; and a second insulating film formed to reach the upper surface of the charge transfer electrode from the photoelectric converting portion, and the first and second insulating films include a discontinuing portion.

2. The solid state imaging device according to claim 1, wherein the second insulating film has a region which overlaps with the first insulating film through silicon oxide.

3. The solid state imaging device according to claim 1, wherein the second insulating film constitutes an antireflection film.

4. The solid state imaging device according to claim 1, wherein the charge transferring portion comprises:

a first electrode formed by a first layer conductive film; and a second electrode disposed to get over a part of the first electrode and formed by a second layer conductive film.

5. The solid state imaging device according to claim 1, wherein the charge transferring portion forms a single layer electrode structure in which a first electrode formed by a first layer conductive film and a second electrode formed by a second layer conductive film are juxtaposed with each other through an interelectrode insulating film.

6. The solid state imaging device according to claim 4, wherein the first insulating film is formed to cover an upper surface of a second electrode from an upper surface of a first electrode, and the second insulating film is formed to reach the upper surface of the first electrode from the photoelectric converting portion.

7. The solid state imaging device according claim 1, wherein the second insulating film is formed to have different thicknesses in a region provided on a substrate.

8. A method of manufacturing a solid state imaging device comprising:

forming a photoelectric converting portion and a charge transferring portion including a charge transfer electrode for transferring an electric charge generated in the photoelectric converting portion;

forming an insulating film containing nitrogen for covering the charge transferring portion; and forming a shielding film having an opening on the photoelectric converting portion, wherein, prior to forming the shielding film, forming the insulating film comprises:

forming a first insulating film containing nitrogen and formed to cover at least a part of an upper surface of the charge transferring portion; and forming a second insulating film containing nitrogen and formed to reach the upper surface of the charge transfer electrode from the photoelectric converting portion, and wherein the first insulating film and the second insulating film are formed to have a discontinuing portion.

9. The method of manufacturing a solid state imaging device according to claim 1, wherein the first insulating film and the second insulating film are constituted to have regions superposed through a silicon oxide film.

10. The method of manufacturing a solid state imaging device according to claim 8, wherein the second insulating film is formed to constitute an antireflection film.

11. The method of manufacturing a solid state imaging device according to claim 8, wherein the charge transferring portion comprises:

a first electrode formed by a first layer conductive film; and a second electrode disposed to get over a part of the first electrode and formed by a second layer conductive film.

12. The method of manufacturing a solid state imaging device according to claim 8, wherein the charge transferring portion forms a single layer electrode structure in which a first electrode formed by a first layer conductive film and a second electrode formed by a second layer conductive film are juxtaposed with each other through an interelectrode insulating film.

13. The method of manufacturing a solid state imaging device according to claim 12, wherein forming the first insulating film comprises forming the first insulating film to cover an upper surface of the second electrode from an upper surface of the first electrode, and forming the second insulating film comprises carrying out patterning to reach the upper surface of the first electrode from the photoelectric converting portion.

14. The method of manufacturing a solid state imaging device according to claim 8, wherein forming the second insulating film comprises determining a thickness in order to have a desirable sensitivity corresponding to a sensitivity of the photoelectric converting portion.

15. The method of manufacturing a solid state imaging device according to claim 8, wherein the first and second insulating films are silicon nitride films.

16. The method of manufacturing a solid state imaging device according to claim 8, wherein the shielding film is a tungsten film.

* * * * *